United States Patent
Yoo

(10) Patent No.: US 9,793,223 B2
(45) Date of Patent: Oct. 17, 2017

(54) SEMICONDUCTOR PACKAGE AND METHOD OF MANUFACTURING THE SAME

(71) Applicant: SAMSUNG ELECTRO-MECHANICS CO., LTD., Suwon-si (KR)

(72) Inventor: Jin O Yoo, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

(21) Appl. No.: 15/275,853

(22) Filed: Sep. 26, 2016

(65) Prior Publication Data

US 2017/0012003 A1     Jan. 12, 2017

Related U.S. Application Data

(62) Division of application No. 13/595,435, filed on Aug. 27, 2012, now Pat. No. 9,508,624.

(30) Foreign Application Priority Data

Sep. 30, 2011    (KR) .................. 10-2011-0099649

(51) Int. Cl.
| | |
|---|---|
| H01L 23/31 | (2006.01) |
| H01L 23/552 | (2006.01) |
| H01L 25/065 | (2006.01) |
| H05K 9/00 | (2006.01) |
| H01L 21/56 | (2006.01) |

(52) U.S. Cl.
CPC .......... *H01L 23/552* (2013.01); *H01L 21/56* (2013.01); *H01L 23/315* (2013.01); *H01L 25/0655* (2013.01); *H05K 9/0024* (2013.01); *H01L 23/3121* (2013.01); *H01L 2224/16225* (2013.01); *H01L 2224/73253* (2013.01); *H01L 2924/19105* (2013.01)

(58) Field of Classification Search
CPC .... H01L 25/0655; H01L 23/04; H01L 23/315
See application file for complete search history.

(56) References Cited

U.S. PATENT DOCUMENTS

| | | |
|---|---|---|
| 8,237,293 B2 | 8/2012 | Wong et al. |
| 2009/0091907 A1 | 4/2009 | Huang et al. |
| | (Continued) | |

FOREIGN PATENT DOCUMENTS

| | | |
|---|---|---|
| JP | 8-78483 | 3/1996 |
| KR | 10-2005-0121840 A | 12/2005 |
| | (Continued) | |

OTHER PUBLICATIONS

Korean Office Action dated Nov. 28, 2012 in corresponding Korean Patent Application No. 10-2011-0099649.

*Primary Examiner* — Yu-Hsi D Sun
(74) *Attorney, Agent, or Firm* — NSIP Law

(57) ABSTRACT

There are provided a semiconductor package and a method of manufacturing the same. The semiconductor package includes: a substrate having a ground electrode formed on one surface thereof; at least one electronic component mounted on one surface of the substrate; an insulation layer including an exposed part exposing the ground electrode and a cover part covering the electronic component; and a shielding layer electrically connected to the ground electrode and covering the insulation layer.

7 Claims, 4 Drawing Sheets

(56) References Cited

U.S. PATENT DOCUMENTS

2009/0230487 A1 9/2009 Saitoh et al.
2009/0294930 A1 12/2009 Yoon et al.

FOREIGN PATENT DOCUMENTS

| KR | 10-0877551 B1 | | 1/2009 |
| --- | --- | --- | --- |
| KR | 10-2010-0062316 | * | 6/2010 |
| KR | 10-2010-0062316 A | | 6/2010 |

* cited by examiner

SEMICONDUCTOR PACKAGE AND METHOD OF MANUFACTURING THE SAME

CROSS-REFERENCE TO RELATED APPLICATIONS

This is a divisional application of U.S. patent application Ser. No. 13/595,435, filed on Aug. 27, 2012, which claims the priority of Korean Patent Application No. 10-2011-0099649 filed on Sep. 30, 2011, in the Korean Intellectual Property Office, the disclosure of which is incorporated herein by reference.

BACKGROUND OF THE INVENTION

Field of the Invention

The present invention relates to a semiconductor package, and more particularly, to a semiconductor package having a minimum thickness while having a shielding structure capable of shielding electromagnetic waves, and a method of manufacturing the same.

Description of the Related Art

In the field of electronic products, market demand for portable devices has recently increased. Therefore, the miniaturization and lightening of electronic components mounted in portable electronic products have been continuously demanded.

In order to realize the miniaturization and lightening of these electronic components, a system on chip (SOC) technology, implementing a plurality of individual elements on a single chip, a system in package (SIP) technology having a plurality of individual elements integrated in a single package, or the like, as well as technology for reducing the sizes of individual mounting components is required.

Particularly, it has been necessary for a high frequency semiconductor package, such as a portable television (TV) module using digital multimedia broadcasting (DMB) or a network module handling high frequency signals, to include various electromagnetic wave shielding structures in order to excellently implement electromagnetic interference (EMI) or electromagnetic susceptibility (EMS) shielding characteristics, as well as miniaturization.

In addition, as functions of information technology (IT) devices such as smart phones, tablet computers and the like increase, an amount of information capable of being displayed on a single screen has gradually increased. According to the related art, in the case of components included in these IC devices, a reduction in thickness, rather than area, has become important.

A general shielding structure has a form in which components to be shielded are disposed on a printed circuit board and a metal shielding material is soldered to the printed circuit board or the components are covered using a soldering fixture. In this case, a predetermined interval should be maintained between the metal shielding material or the soldering fixture and the components, and the metal shielding material or the soldering fixture has its own thickness, such that the overall thickness of a product increases.

SUMMARY OF THE INVENTION

An aspect of the present invention provides a semiconductor package having the minimum overall thickness while having a stable shielding structure, and a method of manufacturing the same.

Another aspect of the present invention provides a semiconductor package in which a shielding structure and a substrate may be easily grounded, and a method of manufacturing the same.

According to an aspect of the present invention, there is provided a semiconductor package including: a substrate having a ground electrode formed on one surface thereof; at least one electronic component mounted on one surface of the substrate; an insulation layer including an exposed part exposing the ground electrode and a cover part covering the electronic component; and a shielding layer electrically connected to the ground electrode and covering the insulation layer.

The substrate may include at least one shielding area, and the exposed part may enclose the shielding area.

The exposed part may have a dotted line or a solid line shape.

A distance from the electronic component to an outer surface of the shielding layer may be 10 to 30 µm.

The ground electrode may be formed by exposing copper foil of the substrate having ground attributes.

According to another aspect of the present invention, there is provided a method of manufacturing a semiconductor package, the method including: preparing a substrate having a ground electrode formed on one surface thereof and at least one electronic component formed on one surface of the substrate; stacking and compressing an insulation material so as to cover the substrate; forming an insulation layer including an exposed part exposing the ground electrode by removing a portion of the insulation material and a cover part covering the electronic component; and forming a shielding layer by applying a conductive material to the insulation layer.

The forming of the shielding layer may be undertaken by applying the conductive material in a spray coating scheme.

The exposed part may be formed by removing the portion of the insulation material using a laser beam.

The insulation material may be insulation tape.

The stacking and compressing of the insulation material may include: attaching the insulation material to the substrate; and rolling or pressing the insulation material.

According to another aspect of the present invention, there is provided a method of manufacturing a semiconductor package, the method including: preparing a substrate having a ground electrode formed on one surface thereof and at least one electronic component formed on one surface of the substrate; and attaching composite tape to the substrate, the composite tape including a shielding layer formed of a conductive material and an insulation layer formed on the shielding layer and including an exposed part exposing a portion of the shielding layer to thereby electrically connect the shielding layer to the ground electrode and a cover part covering the electronic component.

The method may further include rolling or pressing a surface of the composite tape attached to the substrate.

The exposed part may have a dotted line or a solid line shape.

The substrate may include at least one shielding area, and the exposed part may enclose the shielding area.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Hereinafter, embodiments of the present invention will be described in detail with reference to the accompanying drawings.

In describing the present invention, terms indicating components of the present invention are named in consideration of functions thereof. Therefore, the terms indicating components should not be understood as being limited to technical components of the present invention.

Figure 1:
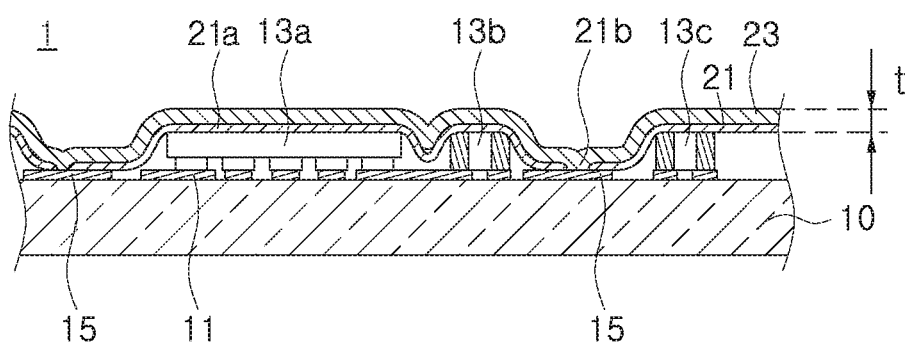
FIG. 1 is a cross-sectional view of a semiconductor package according to an embodiment of the present invention.

FIG. 1 is a cross-sectional view of a semiconductor package according to an embodiment of the present invention. Hereinafter, a semiconductor package 1 according to an embodiment of the present invention will be described in detail with reference to FIG. 1.

Referring to FIG. 1, the semiconductor package 1 according to the embodiment of the present invention may include a substrate 10 having a ground electrode 15 formed thereon, at least one or more electronic components 13a, 13b, and 13c mounted on the substrate 10, an insulation layer 21 covering the electronic components 13a, 13b, and 13c, and a shielding layer 23 formed on the insulation layer.

The substrate 10 may have at least one or more electronic components mounted on one surface thereof. As the substrate 10, various kinds of substrates (for example, a ceramic substrate, a printed circuit board (PCB), a flexible substrate, or the like) well known in the art may be used.

The substrate 10 may include at least one or more mounting electrodes 11 formed on one surface thereof in order to mount the electronic components 13a, 13b, and 13c and include wiring patterns formed thereon in order to electrically connect these mounting electrodes 11 to each other. The substrate 10 may be a multi-layer substrate formed of a plurality of layers, and circuit patterns for forming electrical connections may be formed between the plurality of layers.

According to the embodiment of the present invention, the ground electrode 15 may be formed on the substrate 10. The ground electrode 15 may be formed by exposing copper foil formed on the substrate 10 and having ground attributes, but is not limited thereto.

The insulation layer 21 may cover at least one or more electronic components mounted on one surface of the substrate. According to the embodiment of the present invention, the insulation layer 21 may be formed of insulation tape, but is not particularly limited thereto. The insulation layer 21 may be attached to one surface of the substrate to thereby fix the electronic components and insulate the electronic components from the other components and electrodes.

The insulation layer 21 may include a cover part 21a covering the electronic components and an exposed part 21b exposing the ground electrode.

The cover part 21a may serve to insulate the electrode components from the other components or electrodes while fixing the electrode components, and may prevent the subsequently formed shielding layer and the electronic components from being electrically connected to each other.

The exposed part 21b may serve to expose the ground electrode 15 formed on the substrate 10 and may divide at least one or more shielding areas. The exposed part 21b may have a solid line or a dotted line shape and be formed so that the ground electrode 15 and the subsequently formed shielding layer are entirely or partially connected to each other.

In other words, the substrate 10 may include at least one or more shielding areas, and the exposed part 21b may enclose the shielding areas.

Referring to FIG. 1, according to the embodiment of the present invention, the semiconductor package 1 may be divided into at least two shielding areas. More specifically, the semiconductor package 1 may be divided into one shielding area including first and second electronic components 13a and 13b and the other shielding area including a third electronic component 13c. One shielding area and the other shielding area may block signals or electromagnetic waves between different shielding areas as well as signals or electromagnetic waves introduced from the outside.

In addition, each of the shielding areas may be enclosed by the exposed part 21b. That is, the exposed part 21b is electrically connected to the ground electrode 15 while enclosing the shielding area, whereby an excellent shielding structure may be formed.

The shielding layer 23 may cover the electronic components 13a, 13b, and 13c and an outer portion of the insulation layer 21. The shielding layer 23 may be formed on an outer surface of the insulation layer 21 covering the electronic components 13a and 13b, and 13c to thereby serve to shield unnecessary electromagnetic waves introduced from the outside of the substrate 10. In addition, the shielding layer 23 may block electromagnetic waves generated in the electronic components 13a, 13b, and 13c from being radiated to the outside.

This shielding layer 23 may cover the entire outer surface of the insulation layer 21 and particularly cover the exposed part 21b of the insulation layer 21 to thereby be electrically connected to the ground electrode 15.

According to the embodiment of the present invention, the shielding layer 23 may be formed of various materials having conductivity. For example, the shielding layer 23 may be formed of a resin material containing a conductive powder or be formed of a metal thin film, but is not particularly limited thereto. When the shielding layer 23 is formed of the metal thin film, it may be formed by various methods such as a sputtering method, a physical/chemical vapor deposition method, an electroplating method, and an electroless plating method.

In addition, the shielding layer 23 may be a metal thin film formed by a spray coating method. The spray coating method has advantages in that it may form a uniform thin film and has low costs required in terms of equipment investment as compared to other methods. In the case of forming the shielding layer 23 to have a thin film shape through the spray coating method, manufacturing time and manufacturing costs may be reduced.

According to the embodiment of the present invention, a distance t from the electronic component to the outer surface of the shielding layer 23 may be 10 to 30 μm.

In the case of a general shielding structure, since the electronic component and the shielding layer are spaced apart from each other, having a predetermined interval therebetween, a distance from the electronic component to the outer surface of the shielding layer 23 may be about 200 to 400 μm, which is obtained by summing a predetermined interval (100 to 200 μm) for electrical insulation between the electronic component and the shielding layer and a thickness (100 to 200 μm) of the shielding layer itself.

However, according to the embodiment of the present invention, the shielding layer 23 itself is formed in a thin film shape, such that it has a significantly reduced thickness. Furthermore, since the insulation layer is formed between the electronic component and the shielding layer, the electronic component and the shielding layer may be adjacent to each other, having the insulation layer therebetween. That is, it is not required to space the electronic component and the shielding layer from each other by a predetermined interval for electrical insulation therebetween, unlike the case according to the related art. Therefore, a distance from the electronic component to the outer surface of the shielding layer 23 may be 10 to 30 μm.

When the distance from the electronic component to the outer surface of the shielding layer 23 is less than 10 μm, the thickness of the shielding layer 23 is excessively thin, such that a stable shielding structure may not be obtained. When the distance from the electronic component to the outer surface of the shielding layer 23 exceeds 30 μm, there is a risk that the thickness of the electronic component will be excessively increased. Therefore, the distance from the electronic component to the outer surface of the shielding layer 23 may be 10 to 30 μm.

According to the embodiment of the present invention, a semiconductor package capable of having a reduced thickness while having a stable shielding structure may be provided.

FIGS. 2A through 2G are views showing a method of manufacturing a semiconductor package according to an embodiment of the present invention.

Hereinafter, a method of manufacturing a semiconductor package according to an embodiment of the present invention will be described with reference to FIGS. 2A through 2G.

The method of manufacturing the semiconductor package according to the embodiment of the present invention may include preparing a substrate having a ground electrode formed on one surface thereof and at least one or more electronic components formed on one surface of the substrate (See FIG. 2A); stacking and compressing an insulation layer so as to cover the substrate (See FIGS. 2B and 2C); forming an exposed part exposing the ground electrode by removing a portion of the insulation layer and a cover part covering the at least one or more electronic components (See 2D); and applying a conductive material to the exposed part and the cover part (See. 2E).

Figure 2A:
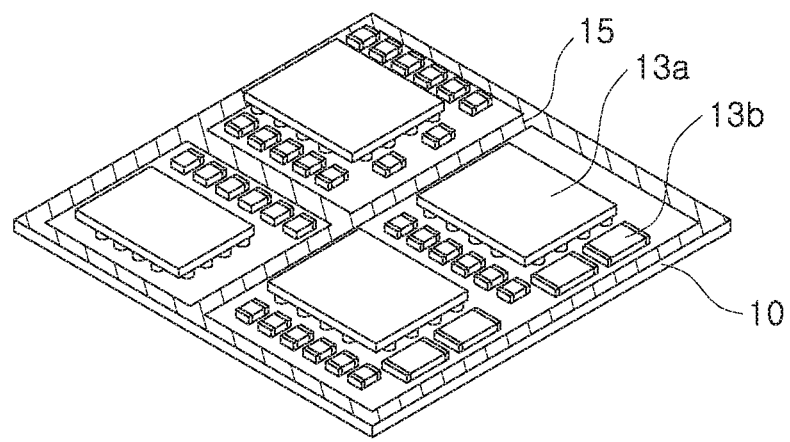
FIGS. 2A through 2F are views showing a method of manufacturing a semiconductor package according to an embodiment of the present invention.

Referring to FIG. 2A, in order to manufacture the semiconductor package, the substrate 10 having the ground electrode 15 formed on one surface thereof may be prepared, and at least one or more electronic components 13a and 13b may be mounted on one surface of the substrate.

The substrate 10 may be a multi-layer circuit substrate formed of a plurality of layers, and circuit patterns 12 may be formed between the plurality of layers to thereby be electrically connected to each other. More specifically, the substrate 10 may include the circuit patterns, the ground electrodes, the mounting electrodes, and the like, mounted thereon.

According to the embodiment of the present invention, the ground electrodes 15 may enclose the shielding areas and be electrically connected to the shielding layer through the exposed part of the insulation layer in a subsequent process to thereby shield each shielding area of the semiconductor package.

The ground electrode 15 may be formed by exposing copper foil having ground attributes on the substrate 10 and may be formed as a pattern, similar to the mounting electrode, but is not limited thereto.

Figure 2B:
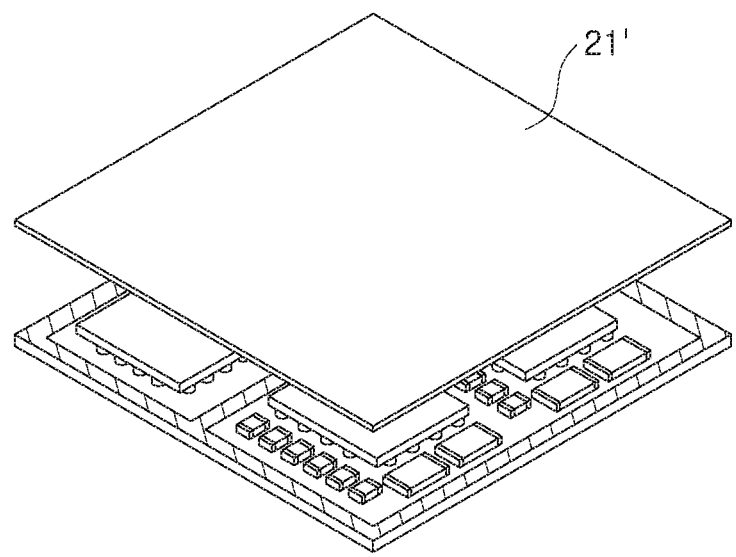
Figure 2C:
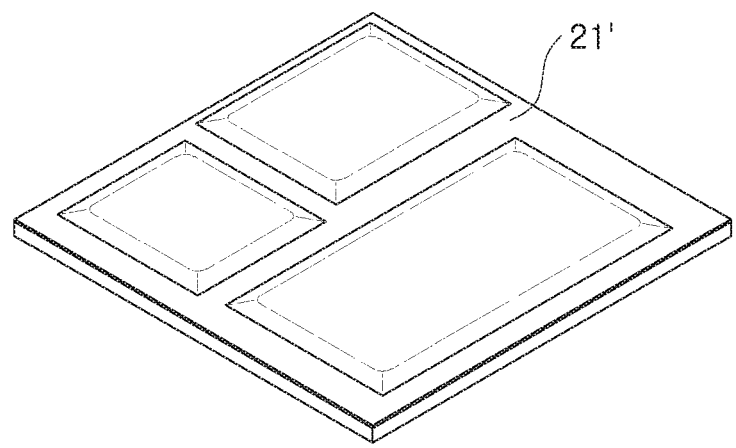

Referring to FIGS. 2B and 2C, the insulation layer 21 may be stacked and compressed on the substrate 10 having the at least one or more electronic components mounted thereon.

Referring to FIG. 2B, an insulation material such as insulation tape 21' is attached to the at least one or more electronic components formed on the substrate 10. In addition, referring to FIG. 2C, the insulation tape may be attached to the substrate 10 while significantly reducing empty space within the electronic components by rolling or pressing a surface of the insulation tape, but is not particularly limited thereto. That is, various methods for attaching the insulation tape to the substrate 10 may be used.

Therefore, even in the case in which a shielding structure is attached to the electronic component in a subsequent process, an insulation state may be maintained. Due to the insulation layer, the shielding structure and the electronic component are attached to each other to thereby manufacture a semiconductor package having a reduced thickness.

Figure 2D:
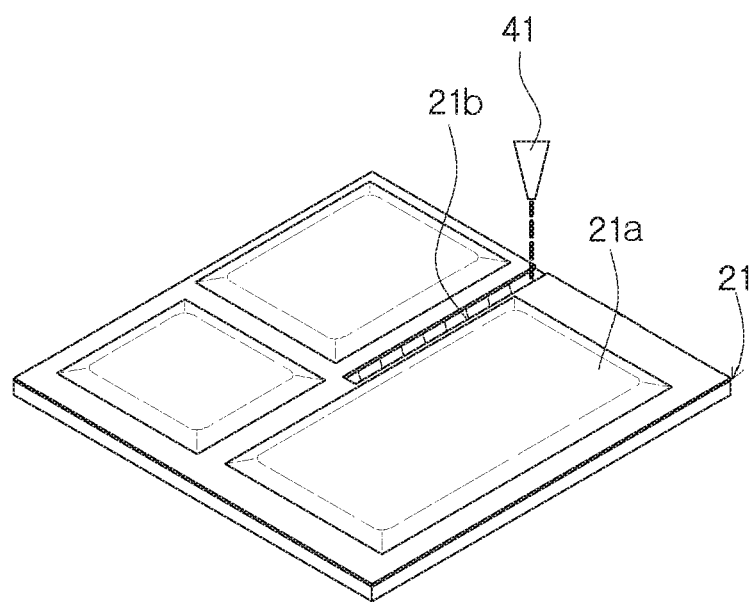

Referring to FIG. 2D, the insulation layer 21 may be formed such that the portion of the insulation material such as the insulation tape may be removed to form the exposed part 21b exposing the ground electrode, and the cover part 21a covering the electronic component may be formed.

The portion of the insulation material may be removed by a laser beam 41 but is not particularly limited thereto. That is, various cutting or removing methods such as a mechanical method may be used.

The substrate 10 according to the embodiment of the present invention may include at least one or more shielding areas, and the exposed part 21b may be formed to enclose each shielding area.

Referring to FIG. 2D, the substrate 10 may include three shielding areas, each of which may be enclosed by the exposed part 21b. The shielding layer formed in a subsequent process may be electrically connected to the ground electrode through the exposed part 21b. Therefore, each shielding area may not be affected by electromagnetic waves from the outside, or electromagnetic waves may not be discharged from the electronic component to the outside. Furthermore, interference due to the discharging of signals or electromagnetic waves between the shielding areas may be prevented. That is, electromagnetic waves may be blocked between the shielding areas.

The exposed part 21b may have a solid line or a dotted line shape. When the exposed part has the solid line shape, the ground electrode and the shielding layer may be entirely connected to each other. When the exposed part has the dotted line shape, the ground electrode and the shielding layer may be partially connected to each other.

Figure 2E:
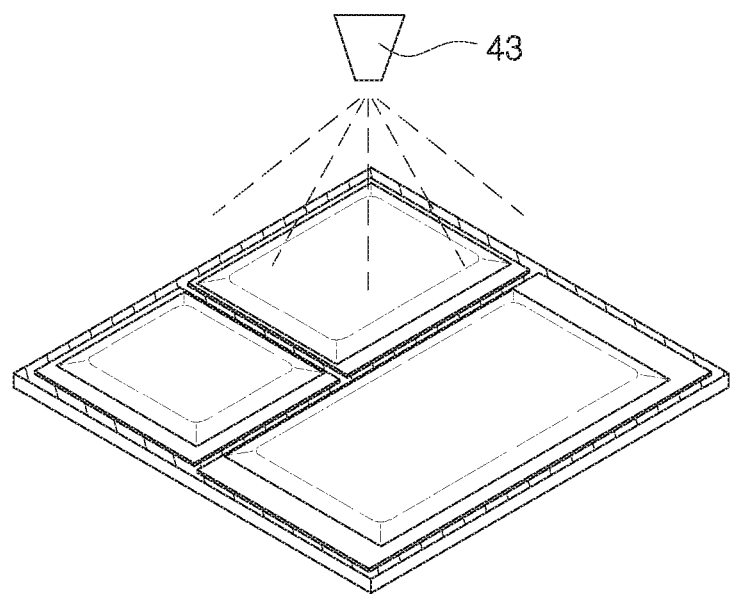
Figure 2F:
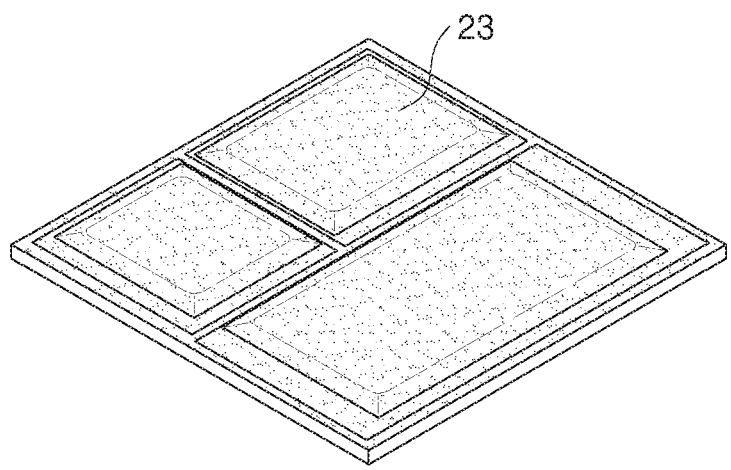

Referring to FIGS. 2E and 2F, after the insulation layer 21 is formed, the shielding layer 23 may be formed by applying a conductive material to the insulation layer 21.

Referring to FIG. 2E, the shielding layer 23 may be formed by spraying the conductive material to the insulation layer 22 using a spray 43. However, a method of forming the shielding layer 23 is not particularly limited thereto. For example, the shielding layer 23 may be formed by applying a conductive material containing a resin, applying a conductive material by a physical or chemical deposition method, or applying a conductive material by an electroplating or electroless plating method.

The shielding layer 23 may be formed by using a spray coating method. Therefore, the shielding layer may be formed as a metal thin film. The spray coating method may be more environment-friendly and may be reduced in terms of the necessity for investment in equipment as compared to other methods.

In a method of manufacturing a semiconductor package according to another embodiment of the present invention, the semiconductor package may be manufactured using composite tape provided in a form in which a shielding layer and an insulation layer are formed integrally with each other.

More specifically, the semiconductor package may be manufactured by preparing a substrate having a ground electrode on one surface thereof and at least one electronic component formed on one surface of the substrate and attaching the composite tape to one surface of the substrate so that the ground electrode and the shielding layer are electrically connected to each other.

The composite tape may include a shielding layer formed of a conductive material and an insulation layer formed on the shielding layer and including an exposed part exposing a portion of the shielding layer to thereby electrically connect the shielding layer to the ground electrode and a cover part covering the electronic component.

Even in the case of attaching the composite tape to the substrate, the same method as the method of manufacturing the semiconductor package described above may be employed in forming the insulation layer and the shielding layer. The method may further include rolling or pressing a surface of the composite tape attached to the substrate, and accordingly, a semiconductor package having a reduced thickness may be manufactured.

According to the embodiment of the present invention, in the case of using the composite tape, the method of manufacturing the semiconductor package may be simplified. In addition, since the insulation layer is formed between the shielding layer and the electronic component, it is not required to space the shielding layer and the electronic component from each other, whereby the thickness of the semiconductor package may be reduced.

As set forth above, in a semiconductor package and a method of manufacturing the same according to embodiments of the present invention, a shielding layer is formed to be connected to a ground electrode formed on an upper surface of a substrate in order to shield electromagnetic waves, whereby a semiconductor package may be manufactured in a simplified manner while having stable ground performance.

In addition, a semiconductor package according to embodiments of the present invention is manufactured by forming an insulation layer and a shielding layer on an outer surface of an electronic component, whereby the thickness of the semiconductor package actually increases by only the thicknesses of the insulation layer and the shielding layer.

Therefore, the thickness of the semiconductor package is significantly reduced, whereby the semiconductor package may be easily mounted on a thin electronic product.

While the present invention has been shown and described in connection with the embodiments, it will be apparent to those skilled in the art that modifications and variations can be made without departing from the spirit and scope of the invention as defined by the appended claims.

What is claimed is:

1. A method of manufacturing a semiconductor package, the method comprising:
    preparing a substrate having a ground electrode formed on one surface thereof and at least one electronic component formed on one surface of the substrate;
    stacking and compressing an insulation material to cover the substrate;
    forming an insulation layer including an exposed part exposing the ground electrode by removing a portion of the insulation material and a cover part covering the electronic component; and
    forming a shielding layer by applying a conductive material to the insulation layer.

2. The method of claim 1, wherein the forming of the shielding layer is undertaken by applying the conductive material in a spray coating scheme.

3. The method of claim 1, wherein the exposed part is formed by removing the portion of the insulation material using a laser beam.

4. The method of claim 1, wherein the insulation material is insulation tape.

5. The method of claim 1, wherein the stacking and compressing of the insulation material includes:
    attaching the insulation material to the substrate; and
    rolling or pressing the insulation material.

6. The method of claim 1, wherein the exposed part has a dotted line or a solid line shape.

7. The method of claim 1, wherein the substrate includes at least one shielding area, and
    the exposed part encloses the shielding area.

* * * * *